(12) United States Patent
Mahony et al.

(10) Patent No.: US 7,215,212 B2
(45) Date of Patent: May 8, 2007

(54) APPARATUS FOR MONITORING TEMPERATURE AND METHOD FOR OPERATING SAME

(75) Inventors: Michael Joseph Mahony, Schenectady, NY (US); Daniel White Sexton, Niskayuna, NY (US); John Erik Hershey, Ballston Lake, NY (US)

(73) Assignee: General Electric Company, Niskayuna, NY (US)

( * ) Notice: Subject to any disclaimer, the term of this patent is extended or adjusted under 35 U.S.C. 154(b) by 453 days.

(21) Appl. No.: 10/822,322

(22) Filed: Apr. 12, 2004

(65) Prior Publication Data

US 2005/0225415 A1   Oct. 13, 2005

(51) Int. Cl.
G01K 7/00 (2006.01)
H03B 5/24 (2006.01)
H03K 3/03 (2006.01)

(52) U.S. Cl. .................. 331/66; 331/57; 331/179; 374/100; 374/163

(58) Field of Classification Search ............... 331/57, 331/65, 66, 179; 374/100, 163
See application file for complete search history.

(56) References Cited

U.S. PATENT DOCUMENTS

| | | | |
|---|---|---|---|
| 3,260,116 A * | 7/1966 | Grady, Jr. .................. 374/183 |
| 4,079,338 A | 3/1978 | Kronlage | |
| 4,227,185 A | 10/1980 | Kronlage | |
| 4,448,549 A | 5/1984 | Hashimoto et al. | |
| 4,549,818 A | 10/1985 | Nishikubo et al. | |
| 4,658,407 A | 4/1987 | Iwama | |
| 4,872,765 A | 10/1989 | Schodowski | |
| 5,343,869 A | 9/1994 | Pross et al. | |
| 5,418,499 A | 5/1995 | Nakao | |
| H1744 H | 8/1998 | Clayton et al. | |
| 5,844,862 A | 12/1998 | Cocatre-Zilgien | |
| 5,919,141 A | 7/1999 | Money et al. | |
| 5,956,289 A | 9/1999 | Norman et al. | |
| 6,470,200 B2 | 10/2002 | Walker et al. | |
| 6,650,190 B2 | 11/2003 | Jordan et al. | |
| 6,948,388 B1 * | 9/2005 | Clayton et al. ........... 73/862.68 |
| 2002/0075163 A1 | 6/2002 | Smith et al. | |
| 2003/0141910 A1 | 7/2003 | Reindl | |

FOREIGN PATENT DOCUMENTS

| | | |
|---|---|---|
| WO | WO 97/31249 A1 | 8/1997 |
| WO | WO 02/48662 A2 | 6/2002 |
| WO | WO 02/069099 A2 | 9/2002 |
| WO | WO 03/043494 A1 | 5/2003 |

* cited by examiner

*Primary Examiner*—David Mis
(74) *Attorney, Agent, or Firm*—Jean K. Testa; Curtis B. Brueske (57) ABSTRACT

The present invention is directed to a system that enables the simultaneous remote monitoring of a plurality of infants' skin temperatures. The system comprises an electronic circuit that combines the functions of sensing and multiple-channel transmitting, a pre-deployment temperature bath for calibration of the temperature sensor(s), and a receiving and reporting station for centralized monitoring the infants' skin temperatures. The present invention is further directed to a temperature sensor that measures the temperature and transmits the data in multiple channels to a remote receiver. In one embodiment, the temperature sensor comprises a ring oscillator, having a plurality of odd number of inverters, and the ring oscillator is capable of utilizing less than all of the inverters in the ring to modulate the frequency of the signal. In another embodiment, the temperature sensor comprises one inverter and a plurality of delay elements and sensor transmits phase shifted signals to modulate the signals. A signal processing method is also disclosed.

27 Claims, 6 Drawing Sheets

FIG. 1
(CONVENTIONAL)

APPARATUS FOR MONITORING TEMPERATURE AND METHOD FOR OPERATING SAME

FIELD OF THE INVENTION

This invention generally relates to ring oscillators that sense temperatures and transmit same to a remote receiver, and more particularly to thermometric ring oscillators that can oscillate in multiple channels.

BACKGROUND OF THE INVENTION

Thermometric ring oscillators are temperature sensors. Other temperature sensors include thermometers, thermocouples, thermistors, resistance temperature detectors, oscillate crystals and junction diodes, among others. Typically these sensors are placed in close proximity to the point where a temperature measurement is desired, and are connected by wires to electronic components that process the output of the sensors. In many applications, however, the wires connecting to the sensors are inconvenient. In a manufacturing production line, for example, the sensors may be moving while the measured objects remain stationary. In other applications, a temperature sensing point may be difficult to access, such as inside a nuclear reactor or other harsh or sensitive environment, where wired connections may be impractical.

Thermometric ring oscillators typically comprise an odd number of inverters connected in series to each other. The output of one inverter is connected to the input of an adjacent inverter, and the output of the last inverter is connected to the input of the first inverter. U.S. Pat. No. 5,418,499, among other references, discloses that such ring oscillators oscillate at a range of known frequencies and that ring oscillators have been used as internal clocks in computers and other electronic equipments. The '499 patent also discloses a variable ring oscillator that in response to a switching signal less than all of the inverters in the ring can be connected together to control the output frequency of the oscillation signal. Hence, a wider range of frequency band can be utilized. The oscillate frequencies of ring oscillators, however, suffer from performance variations due to the actual voltages applied to the inverters and to the operating temperatures of the electronic equipments.

Constructing and predicting the operating frequencies of ring oscillators are known in the art. See, e.g., "A Method to Derive an Equation for the Oscillation Frequency of a Ring Oscillator," by Stephen Docking and Manoj Sachdev, published in the *IEEE Transactions on Circuits and Systems-I: Fundamental Theory and Applications*, Vol. 50, No. 2, February 2003, pp. 259–264. It is also known in the art that two ring oscillators, seemingly identical in construction, may exhibit differences in respective oscillator frequencies due to differences in supply voltages and minute differences in fabrication, even if the oscillators are monolithically realized and cut from the same wafer. See, e.g., "A CMOS Circuit for Real-Time Chip Temperature Measurement," by Steven R. Boyle and Raymond A. Heald, published in *Compcon Spring '94, Digest of Papers*, Feb. 28-Mar. 4, 1994, pp. 286–291.

Figure 1:
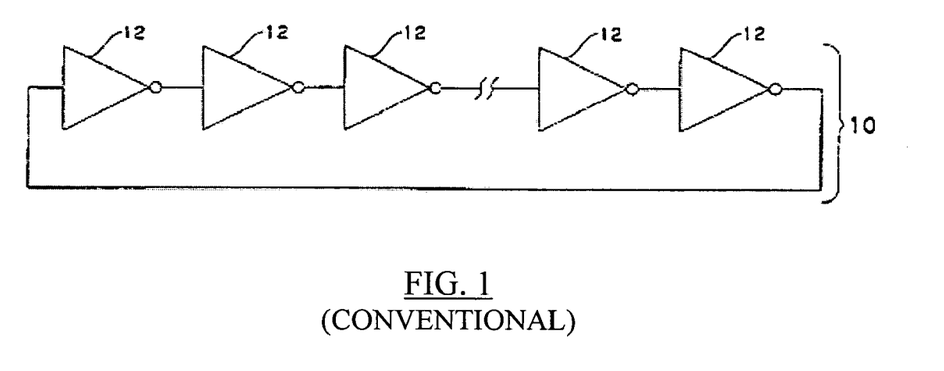
FIG. 1 is a schematic view of a conventional ring oscillator temperature sensor.

As disclosed in U.S. Pat. Nos. 4,448,549, 4,549,818 and 4,658,407, the temperature-induced frequency variations in ring oscillators can be used to measure temperature. As illustrated in FIG. 1, U.S. statutory invention registration No. H1744 discloses a temperature measuring device comprising ring oscillator 10 made from an odd number of inverters 12 having a nominal oscillate frequency, and oscillator 10 is positioned at a location where temperature is to be measured. The ring oscillator emits electromagnetic radiation to an antenna located at a convenient distance from the ring oscillator. The antenna transforms the electromagnetic radiation into an electrical signal. A receiver receives the electrical signal and measures the frequency of the electrical signal to determine the corresponding temperature. The temperature may then be visually monitored from a display or electronically monitored by other devices. This ring oscillator functions both as a temperature sensor and as a wireless transmitter of the frequency representing the temperature to a remote receiver.

However, the prior art does not disclose a wireless ring oscillator temperature sensor that can transmit its frequency over multiple channels.

SUMMARY OF THE INVENTION

Hence, the present invention is directed to a wireless temperature sensor.

The present invention is directed to a wireless ring oscillator sensor, including but not limited to remote temperature measurements of hospitalized patients such as premature newborns.

The present invention is directed to a temperature sensor comprising a thermometric ring oscillator capable of vibrating at a frequency indicative of a temperature at a predetermined location and transmitting a signal comprising said frequency wirelessly to a receiver, wherein the signal is modulated to increase the spectrum of information that can be transmitted to the receiver. In accordance with one aspect of the present invention, the signal is modulated by changing the vibrating frequency of the ring oscillator. In accordance with another aspect, the signal is modulated by shifting the phase of the vibrating frequency.

The present invention is directed to a system that enables the simultaneous remote monitoring of a plurality of infants' skin temperatures. The system comprises an electronic circuit that combines the functions of sensing and multiple-channel transmitting, a pre-deployment temperature bath for calibration of the temperature sensor(s), and a receiving and reporting station for centralized monitoring the infants' skin temperatures.

The present invention is further directed to a temperature sensor that measures the temperature and transmits the data in multiple channels to a remote receiver. In one embodiment, the temperature sensor comprises a ring oscillator, having a plurality of odd number of inverters, and the ring oscillator is capable of utilizing less than all of the inverters in the ring to modulate the frequency of the signal. In another embodiment, the temperature sensor comprises one inverter and a plurality of delay elements and the sensor transmits the phase shifted signals to modulate the signals.

A method for processing the signals received from the sensor(s) is also disclosed.

BRIEF DESCRIPTION OF THE DRAWINGS

In the accompanying drawings, which form a part of the specification and are to be read in conjunction therewith and in which like reference numerals are used to indicate like parts in the various views.

DETAILED DESCRIPTION OF THE PREFERRED EMBODIMENTS

As illustrated in the accompanying drawings and discussed in detail below, the present invention is directed to remote thermometric ring oscillators. The present invention resolves the deficiencies of the known prior art discussed above. Such improvements include, but are not limited to, transmission identification and spectrum sharing. The present invention is described below and illustrated in the accompanying drawings with respect to remote neonatal temperature measurements, but it is understood that the present invention is not limited to this application.

Figure 2:
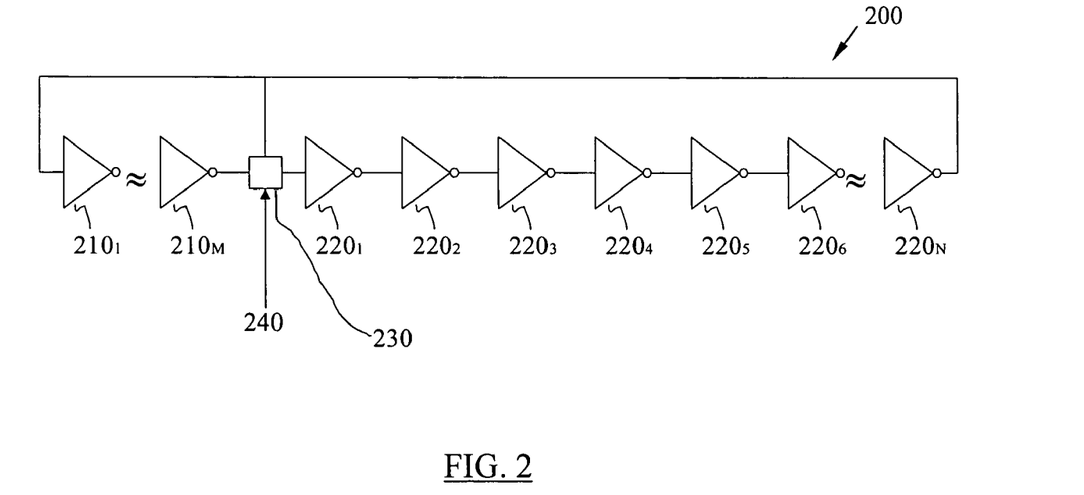
FIG. 2 is a schematic view of a thermometric ring oscillator in accordance with the present invention.

In accordance with a preferred embodiment of the present invention, ring oscillator 200 is capable of oscillating in more than one frequency. Referring to FIG. 2, ring oscillator 200 has a variable number of inverter stages connected serially, namely inverter set $210_1$–$210_M$ and inverter set $220_1$ to $220_N$, and switch 230 disposed between the two sets of inverters. The number of stages can be either N or N+M, where N is an odd number and M is an even number, so that there is always an odd number of stages oscillating. The selection between N stages or N+M stages is made by switch 230 responding to a periodic binary control signal 240. In state A, control signal 240 causes switch 230 to select N stages, and in state B, control signal 240 causes switch 230 to select N+M stages. Switch 230 accomplishes this task by routing the output of inverter stage $220_N$ to the input of inverter stage $220_1$ in state A, and by routing the output of inverter stage $210_M$ to the input of inverter stage $220_1$ in state B.

The control signal 240, thus, causes the ring oscillator to oscillate at two distinct frequencies in this example. Each thermometric ring oscillator used, for example, in the neonatal intensive care ward, is assigned a unique periodic binary control sequence chosen from a set of binary sequences having low cross-correlations. Such a set of sequences is described in "Optimal Binary Sequences for Spread Spectrum Multiplexing", by R. Gold, published in the *IEEE Transactions on Information Theory*, Vol. IT-13, pp. 619–621.

Figure 3:
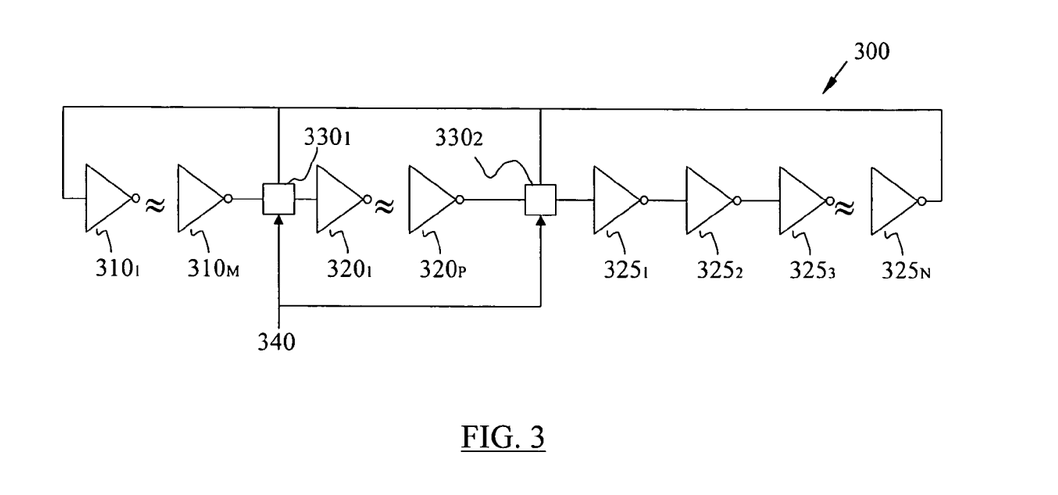
FIG. 3 is a schematic view of another thermometric ring oscillator in accordance with the present invention.

Ring oscillators in accordance with the present invention can oscillate at more than two distinct frequencies. By illustration and not by way of limitation, FIG. 3 illustrates ring oscillator 300 that can oscillate at three distinct frequencies. Ring oscillator 300 comprises inverter sets $310_1$–$310_M$, $320_1$–$320_P$ and $325_1$–$325_N$, and switches $330_1$ and $330_2$ disposed between the sets of inverters. The frequencies are selected by the number of inverter stages including N stages, N+P stages, and N+P+M stages, where N is an odd number and P and M are even numbers. The selection of N or N+P or N+P+M stages is made by switches $330_1$ and $330_2$ according to ternary control signal 340. In state A, control signal 340 causes switch $330_2$ to select N stages; in state B, control signal 340 causes switches $330_1$ and $330_2$ to select N+P stages; and in state C, control signal 340 causes switches $330_1$ and $330_2$ to select N+P+M stages. Alternatively, N+M stages can be selected for state C (or new state D), and the present invention is not limited to any specific combination of stages in each state, so long as the total numbers of stages are odd and the resulting frequencies are distinct.

In state A, in response to control signal 340 switch $330_2$ routes the output of stage $325_N$ to the input of stage $325_1$ to select N stages. In state B, switch $330_2$ routes the output of stage $320_P$ to the input of stage $325_1$ and switch $330_1$ routes the output of stage $325_N$ to the input of stage $320_1$ to select N+P stages. In state C, switch $330_2$ routes the output of stage $320_P$ to the input of stage $325_1$ and switch $330_1$ routes the output of stage $325_N$ to the input of stage $310_1$ to select N+P+M stages. Hence, control signal 340 causes ring oscillator 300 to oscillate at least at three distinct frequencies. Each thermometric ring oscillator used in the neonatal intensive care ward is assigned a unique periodic sequence chosen from a set of ternary sequences having low cross-correlations.

Figure 8:
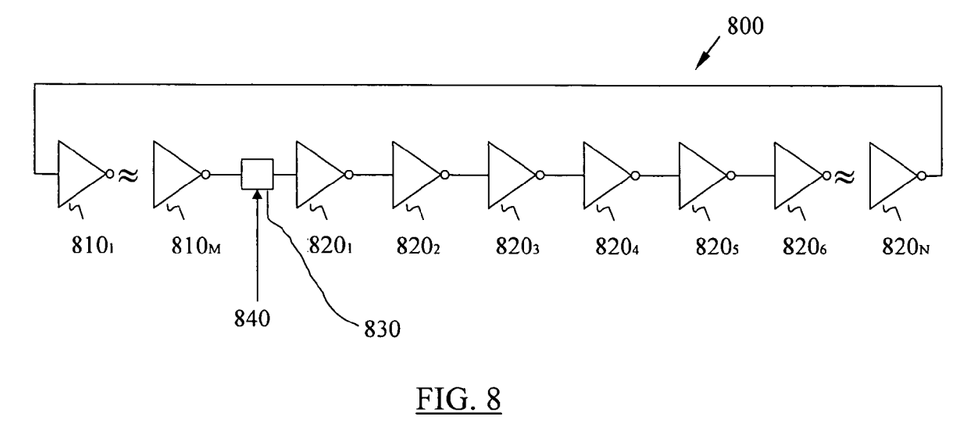
FIG. 8 is a schematic view of another thermometric ring oscillator in accordance with the present invention.

Referring to FIG. 8, a simplified ring oscillator is illustrated. Ring oscillator 800 has N+M, an odd number, of inverter stages connected serially through switch 830. Ring oscillator 800 has inverter sets $810_{1-M}$ and $820_{1-N}$ and switch 840 disposed between the two sets of inverters. In state A, periodic binary control signal 840 causes switch 830 to connect the output of stage $810_M$ to the input of stage $820_1$. In state B, control signal 840 causes switch 830 to disconnect the output of stage $810_M$ from the input of stage $820_1$. There is no oscillation in state B. The control signal 840, thus, causes the ring oscillator to produce an on-off keyed (OOK) signal. When oscillating, the thermometric ring oscillator's frequency will be a function of the monitored neonatal temperature. Each thermometric ring oscillator used in the neonatal intensive care ward is assigned a unique periodic binary control sequence chosen from a set of binary sequences having low cross-correlations, as discussed above.

Figure 4:
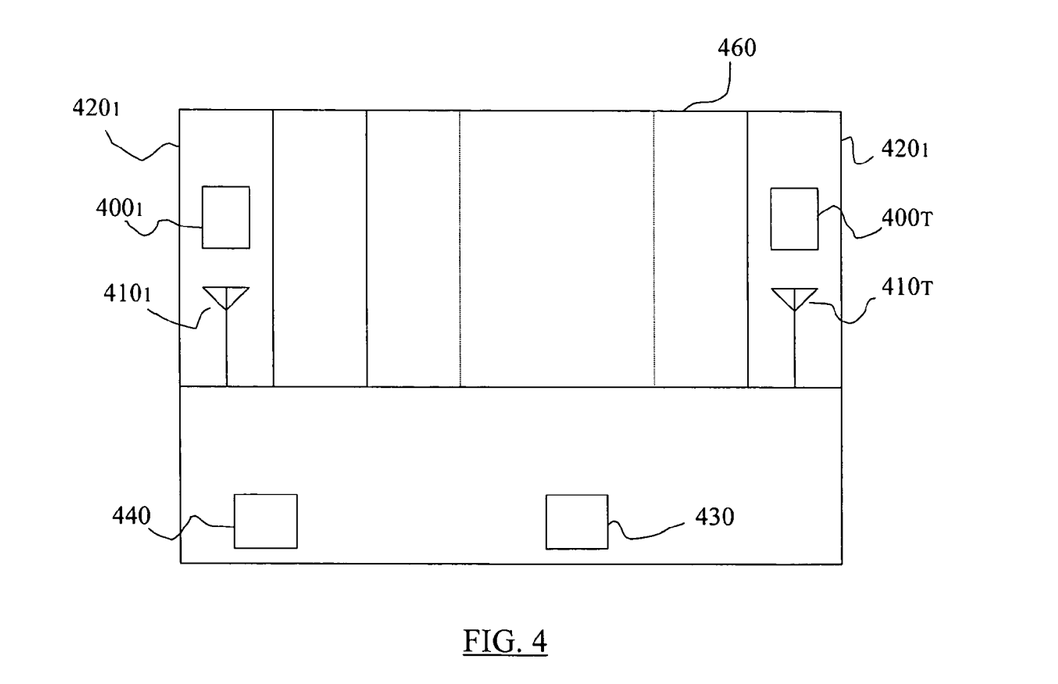
FIG. 4 is a schematic view of a pre-deployment temperature bath for calibrating the thermometric oscillators in accordance with the present invention.
Figure 5:
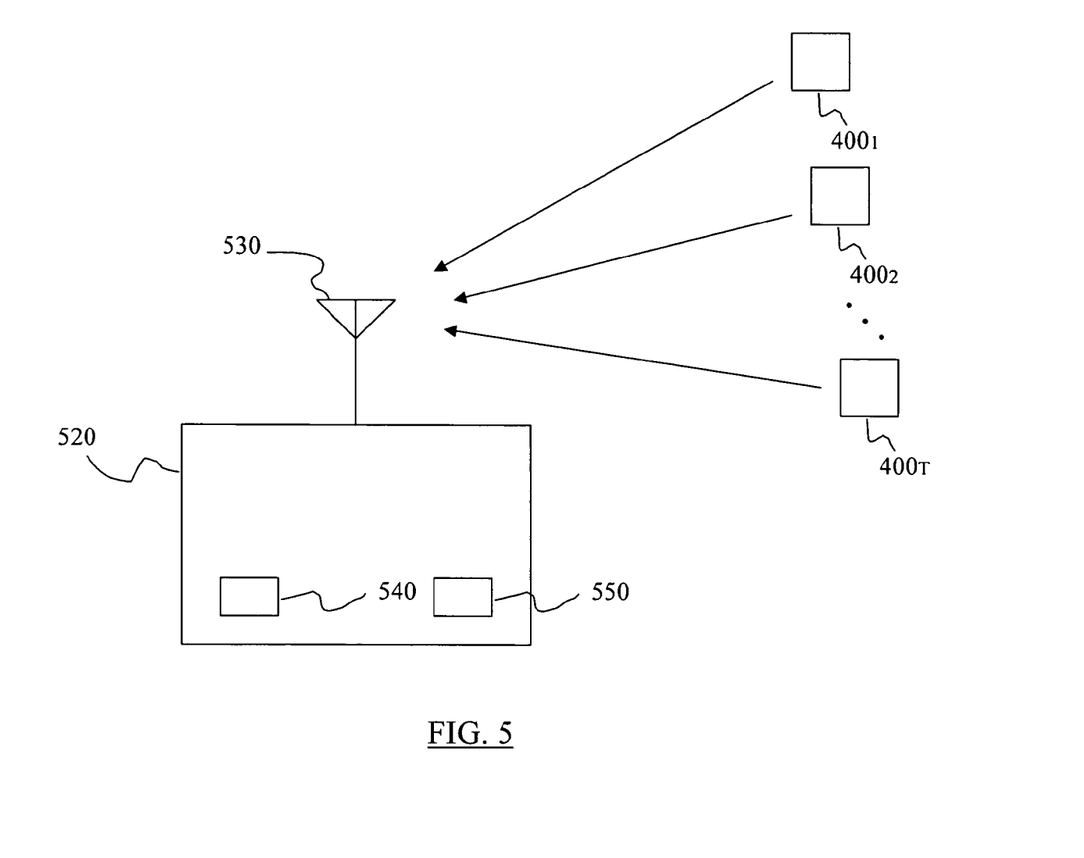
FIG. 5 is a schematic view of a central monitoring station that receives signals from a plurality of thermometric ring oscillators.

The calibration of ring oscillators in accordance with the present invention is illustrated in FIGS. 4 and 5, respectively. Referring to FIG. 4, thermometric oscillators $400_{1-T}$ are calibrated in constant temperature bath 460. Before being attached to a neonate, ring oscillators $400_{1-T}$ reside in bath 460, which is maintained at a preferred reference temperature close to that of expected normal skin temperature of 37° C. Other reference temperatures, such as 0° C., can be used. While in the stabilizing temperature bath 460, the oscillators are powered by electrical source(s). The oscillators are preferably powered by a power cell such as batteries so that no electrical wires are required. Other remote power sources, such as inductive coils, can also be used.

Each oscillator $400_{1-T}$ is housed within dedicated cell $420_{1-T}$, respectively within bath 460, and each cell has receiving/transmitting antenna $410_{1-T}$ located proximate to the thermometric ring oscillator. A control panel 430 controls bath 460. The oscillators vibrate at a frequency representative of bath 460's temperature when the oscillators are stored within bath 460, and this frequency is transmitted through cell antenna $410_{1-T}$ through communications port 440 and received by communications port 540 (FIG. 5) of centralized monitor station 520 (FIG. 5). The connection is not illustrated in the drawings; however, the communication may be by wire, light, RF, ultrasound or other communications means. Preferably, the communication is wireless.

When a thermometric ring oscillator is needed to monitor a neonate or another patient, the operator enters the cell number of the thermometric ring oscillator in bath 460. The operator may also enter the patient's identification tag and other information on control panel 430 and this information may be transmitted to centralized monitor station 520 via the link between communication ports 440 and 540. Control panel 430 can also transmit the binary control signal 240, 840 or ternary control signal 340 or other suitable control signals to the thermometric oscillators to select the number of inverter stages and therefore select the frequency range that each oscillator should vibrate.

The vibrate frequency transmitted by each oscillator $401_{1-T}$, while being stored in bath 460, serves as the reference frequency for the oscillator at the predetermined temperature of bath 460. As noted above, since seemingly identical oscillators do oscillate at different frequencies, it is advantageous to have a reference frequency for each oscillator. In accordance with the present invention, control panel 430 can change the temperature of bath 460 in even increments, e.g., $\pm 1°$ C. or less, and at each temperature increment a reference frequency of each oscillator can be recorded. In this way, a calibration curve of temperature versus vibrate frequency can be established for each oscillator. The calibration curves can be stored electronically in centralized monitor station 520, and incoming frequency from any oscillator is compared against its own calibration curve to determine the measured temperature.

Referring to FIG. 5, the centralized monitor station 520 serves a T number of distinct thermometric ring oscillators $400_{1-T}$, which are broadcasting simultaneously. The broadcasted signals are received at an antenna 530 connected to the centralized monitor station 520. The centralized monitor station 520 is composed of signal processing equipment that synchronizes to each of the T transmissions. Once synchronized to all of the T transmissions, the signal processing equipment measures the transmitting frequency of each of the T ring oscillators, when that oscillator's transmitting frequency is the only oscillator transmitting at or near the center frequency resulting from an oscillator with a given number of stages. In other words, after the centralized monitoring station has properly synchronized or discovered the control signal sequences for all of the deployed thermometric ring oscillators, the centralized monitoring station waits until only a single thermometric ring oscillator is transmitting by using a particular number of inverter stages. The centralized monitoring station then measures the frequency of that oscillator and combines this measurement with the calibration data received from the stabilizing temperature bath 460 through port 540 to ascertain the patient's skin temperature. This measurement is reported via output port 550. The synchronization and signal processing are illustrated in FIGS. 9–12 and further discussed in detail below.

Figure 6:
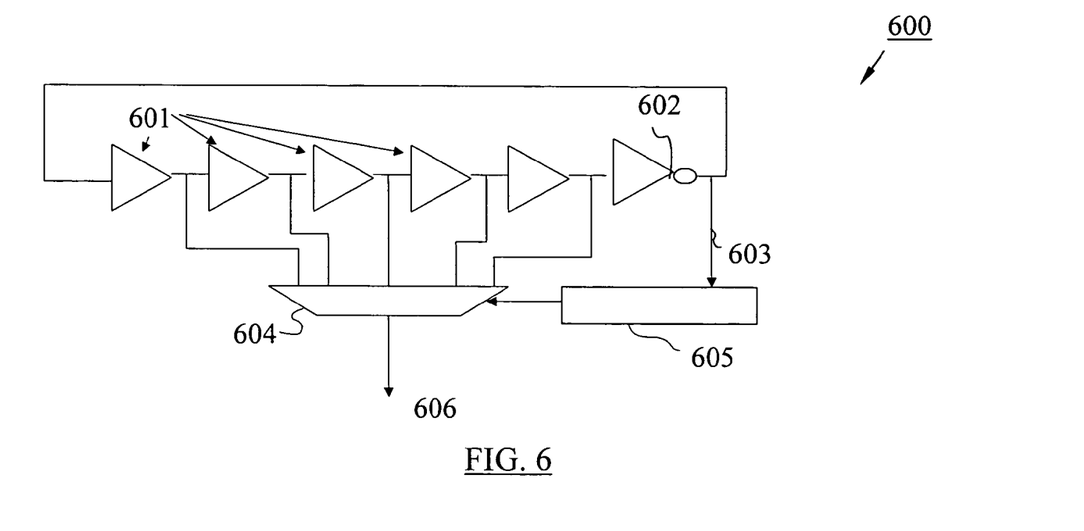
FIG. 6 is a schematic view of another thermometric ring oscillator in accordance with the present invention.
Figure 7:
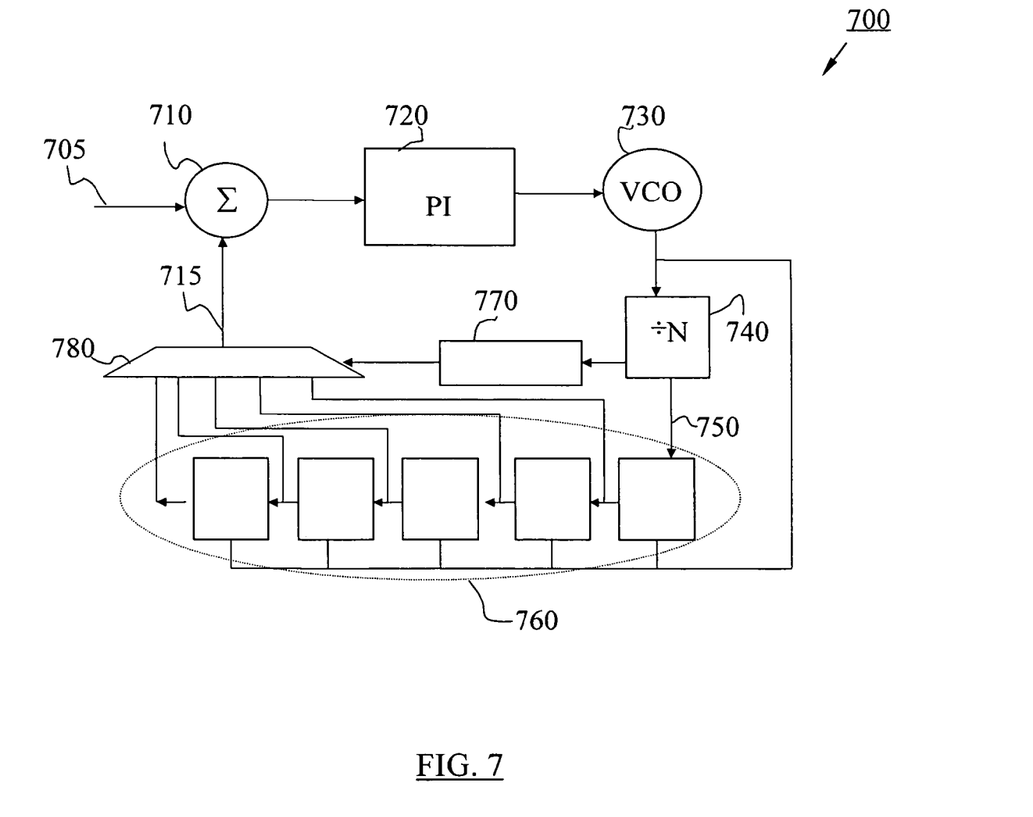
FIG. 7 is a schematic view of an exemplary receiver for the thermometric ring oscillator of FIG. 6.

FIGS. 6 and 7 illustrate another embodiment of the thermometric multi-channel wireless ring oscillator and a corresponding receiving unit in accordance with the present invention, where the signal is modulated by phase shifting. FIG. 6 illustrates a transmitter unit 600 comprising a ring oscillator which has a base frequency dependent on temperature. The ring oscillator consists of delay elements 601 where the delay is dependent on temperature and final inverter 602, which causes oscillations. Inverter 602's output is a frequency signal 603 that oscillates at a frequency determined by the total delay of the loop, which is dependent on temperature. Frequency signal 603 is fed into pseudorandom number generator 604, which superimposes on signal 603 a pseudorandom pattern and then sends the output signal to multiplexer 604. In other words, pseudorandom number generator 605, which is sequenced with the output frequency signal 603, selects which phase of the frequency to output, thereby providing a phase spread version of the output signal. The output of each delay element is then tapped and also fed into multiplexer 604, which selects an output to be used as radiated output signal 606. Multiplexer 604 selects which individual delay to sample. Unlike the embodiments illustrated in FIGS. 2 and 3 where the expansion of the spectrum is by modulating the frequencies of the signals, transmitter 600 spreads the spectrum of information to minimize interference among the signals by modulating the phase shift of radiated output signal 606. Also, by modulating the phase shift, transmitter 600 creates multiple channels from which the transmitter can transmit signals.

FIG. 7 illustrates a receiver 700 adapted to receive radiated signal 606, renumbered as signal 705. Receiver 700 operates as a modified phase lock loop (PLL) where the received signal 705 is summed in summer ($\Sigma$) 710 with an internally derived signal 715 generated by multiplexer 780, discussed below. If both signals are equal, then no difference is generated. If a difference is generated, that is fed into a proportional plus integral block (PI) 720. PI 720 could also be constructed out of differential or other more complicated structures. The output from PI 720 is used to adjust the frequency and phase of a voltage-controlled oscillator (VCO) 730. This oscillator generates a frequency that is N times higher than the original frequency, where N is equal to the number of different phase selections possible in the transmitter. In the example illustrated in FIG. 6, five delay elements are shown or N=5. The output of VCO 730 is then divided by N in divider 740.

The output of 740 is input to shift register 760 that is clocked by VCO 730, which as shown consists of five registers. The number of registers in shift register 760 should be the same as the number of delay elements in transmitter 600. The output of divider 740 is also fed into pseudorandom generator 770, which is synchronous with the pseudorandom generator 605 in transmitter 600. This selects which output of the shift register to be used as the comparison to the input received signal. The loop locks once a signal is detected that matches the pseudorandom sequences and pulls the oscillator in phase. The frequency of the signal 750 is proportional to the temperature read by the receiver. In other words, pseudorandom generator 770 matches the pseudorandom pattern generated by pseudorandom generator 605, and locks on its frequency by adjusting VCO 730. The adjusted frequency correlates to the measured temperature.

Referring to FIGS. 9–12, a particular example of signal processing suitable for use with the present invention is shown. It is noted that this signal processing is only illustrative. Other methods of signal processing can be used, and the present invention is not limited to the method illustrated hereinafter.

In this example, six (6) thermometric ring oscillators 800 (shown in FIG. 8) are deployed on neonates or other patients, whose temperatures are to be measured. In state A, oscillators 800 vibrate, and the thermometric oscillators' frequencies are indicative of the monitored neonates' temperatures. Each thermometric ring oscillator used in the neonatal intensive care ward is assigned a unique periodic binary control sequence chosen from a set of binary sequences having low cross correlations, as discussed above. Control signal 840 causes the ring oscillator to produce an OOK signal. In this example, the periodic binary control sequences are a set of low duty cycle single baud sequences whose cycle lengths are all different. The six periodic binary control sequences were arbitrarily chosen to be those sequences illustrated in FIG. 9.

Figure 9:
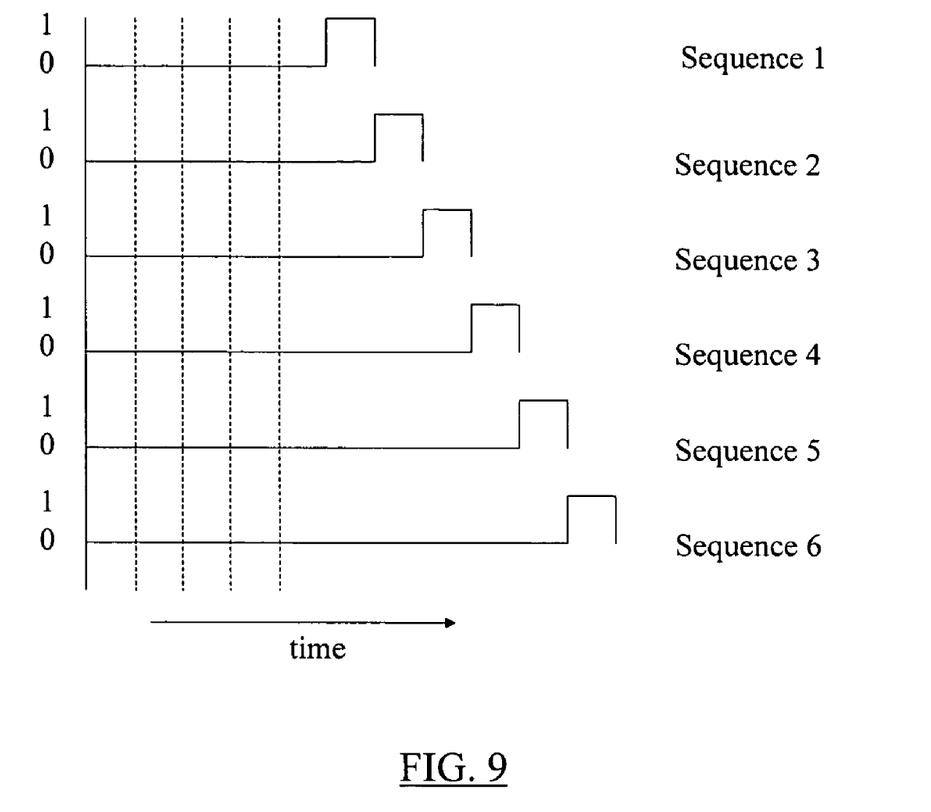
FIG. 9 illustrates N number of exemplary periodic binary control sequences for monitoring N number of thermometric ring oscillators, where N is arbitrarily set at 6.
Figure 10:
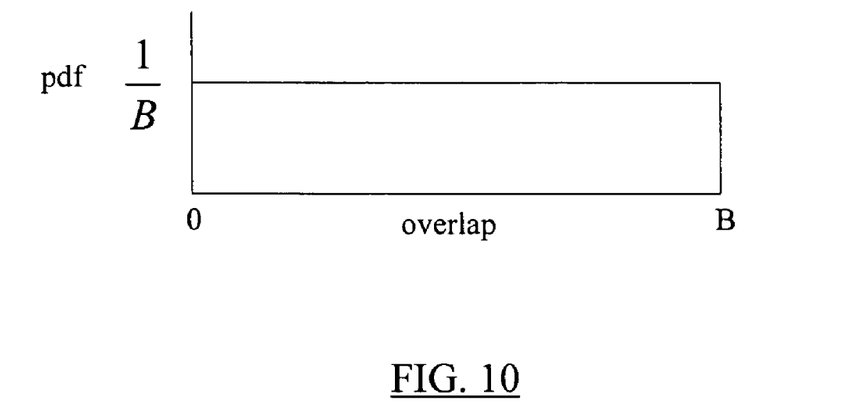
FIG. 10 is the probability density function of an overlap of 1 baud.

The six sequences illustrated in FIG. 9 each has a single "1" baud. The sequence structure is summarized in Table 1.

TABLE 1

Structure of the Exemplary Six Sequences

| Sequence Number | Sequence | Period (bauds) | Duty Cycle |
| --- | --- | --- | --- |
| 1 | 000001 | 6 | 1/6 |
| 2 | 0000001 | 7 | 1/7 |
| 3 | 00000001 | 8 | 1/8 |
| 4 | 000000001 | 9 | 1/9 |
| 5 | 0000000001 | 10 | 1/10 |
| 6 | 00000000001 | 11 | 1/11 |

When a particular monitor is placed on a neonate, the control sequence is assumed to start at a random phase. Thus, if all six monitors were in use and being received at the same aperture, the six control sequence "1" bauds would appear to walk by each other and exhibit pair wise overlaps according to the uniform probability density function (pdf) sketched in FIG. 10. In other words, each of the six sequences illustrated in FIG. 9 and represented in Table 1 is continuously repeating the same pattern. As each pattern repeats itself in a continuous loop, the "1" baud appears to "walk" when viewed by receiver 900, shown in FIG. 11. As the six sequences having different periods, the "1" bauds "walk" at different speeds, and would appear to be overlapping each other at times.

This type of multiple accesses does not optimally share the common spectrum; however, it is simple and requires no external control. It does require the individual transmitters to produce substantially equal length bauds. Also, the baud length should be long enough in order that the individual ring oscillators' operating frequencies will be substantially stable over the baud duration.

Figure 11:
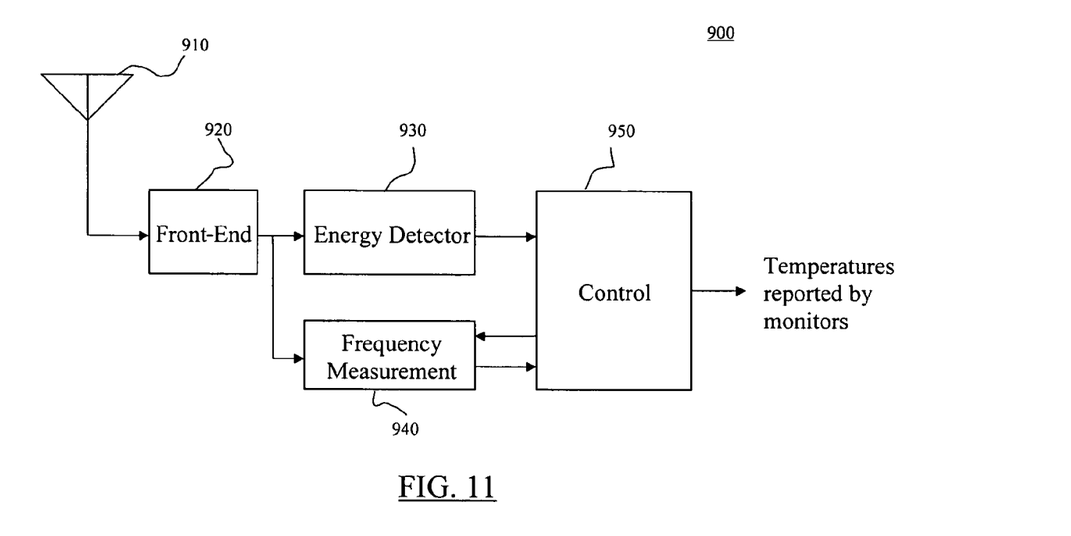
FIG. 11 is a schematic view of a receiver of the frequencies emitted by the thermometric ring oscillators.

Referring to FIG. 11, receiver 900 has an antenna 910 that receives signals from one or more neonatal thermometric ring oscillator sensor/transmitter. The received signals are conditioned, e.g., amplification and/or filtering, by a front-end 920. Energy detector 930 measures the strength of the output of the front-end 920 and declares the presence/absence of received signals to control unit 950. Control unit 950 determines which binary control sequences are being used and when a measurement can be made by the frequency measurement module 940 of the individual ring oscillators.

A suitable algorithm executable by the control unit may contain the following exemplary steps:

1. When the energy detector output exceeds a preset threshold, the control unit decides that a baud has arrived. The control unit then waits and observes the output of the energy detector at the conclusion of a period for all sequences that were not active prior to the control unit's observance of the rise-past-threshold of the energy detector.
2. If a particular sequence's presence is confirmed by the energy detector's output indicating signal input above threshold for k period times of a previously quiet sequence S, then control decides that sequence S is indeed active. In one embodiment, k is a selectable nominal integer, such as 3, and S is a periodic control sequence, as shown, by example, in Table 1, above.
3. Once the control unit has resolved the active sequences, it predicts when each sequence will have a baud that is not overlapped by any other. This prediction is input to the frequency measurement module 940 and the frequency measurement made, and reported to the control unit and converted to the respective neonate temperature and reported out.

A simulation was run with six transmitters using the codes enumerated in Table 1 and the parameter k was arbitrarily chosen to be 3. The pdf of time, measured in baud units, required to discern the presence of the six users and measure each of their reported frequencies is graphed in FIG. 12.

Figure 12:
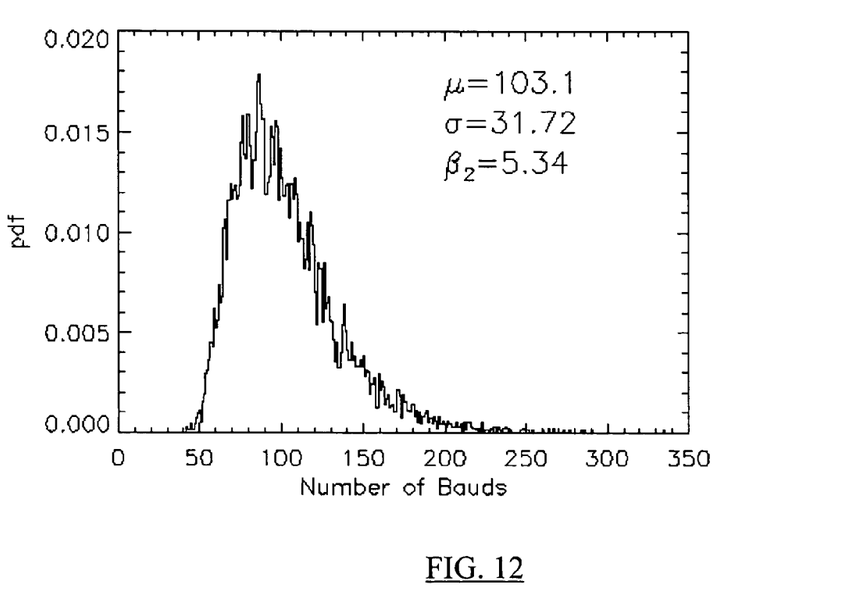
FIG. 12 is a probability density function of the expected waiting time between signals.

The results of FIG. 12 show that the average time (in bauds), $\mu$, to complete transmitter identification and measurement of the six transmitters was about 103 bauds with standard deviation, $\sigma$, of about 32 bauds. As used herein, baud stands for a single time instant, e.g., sequence number 1 is 000001 and has six time units or 6 bauds. The waiting time in second is the waiting time in bauds divided by the number of bauds per second used in the signaling. The shape of the pdf exhibits a kurtosis, $\beta_2$, of 5.34 and the pdf exhibits a non-Gaussian profile. Hence, each sequence will have a baud that is not overlapped by any other during a period of about 103 bauds. FIG. 12 shows that the average wait time between signals (shown on the vertical axis) is reasonable for the type of simple multiple accesses discussed above, and that this data processing is suitable for use in a real-time hospital setting.

While it is apparent that the illustrative embodiments of the invention disclosed herein fulfill the objectives of the present invention, it is appreciated that numerous modifications and other embodiments may be devised by those skilled in the art. Additionally, feature(s) and/or element(s) from any embodiment may be used singly or in combination with other embodiment(s). Therefore, it will be understood that the appended claims are intended to cover all such modifications and embodiments, which would come within the spirit and scope of the present invention.

We claim:

1. A temperature sensor comprising a thermometric ring oscillator capable of vibrating at a frequency indicative of a temperature at a predetermined location and transmitting a signal comprising said frequency wirelessly to a receiver, wherein the signal is modulated to increase the spectrum of information that can be transmitted to the receiver.

2. The temperature sensor of claim 1, wherein the signal is modulated by changing the vibrating frequency of the ring oscillator.

3. The temperature sensor of claim 2, wherein the ring oscillator comprises a plurality of inverter stages and at least a first switch, and wherein in response to a first signal the switch activates a first odd number of stages, which is less than all of the stages, such that the vibrating frequency of the ring oscillator with the first odd number of stages is different than the vibrating frequency of the ring oscillator with all of the stages.

4. The temperature sensor of claim 3, wherein in response to an all signal, the switch activates all of the stages.

5. The temperature sensor of claim 3, wherein the first and all signal comprise a binary signal.

6. The temperature sensor of claim 3, wherein the ring oscillator further comprises a second switch, and wherein in response to a second signal the switches activate a second odd number of stages, which is less than all of the stages, such that the vibrating frequency of the ring oscillator with the second odd number of stages is different than the vibrating frequency of ring oscillator with all of the stages.

7. The temperature sensor of claim 6, wherein the vibrating frequency of the ring oscillator with the second odd number of stages is different than the vibrating frequency of ring oscillator with the first odd number of stages.

8. The temperature sensor of claim 6, wherein in response to an all signal, the switch activates all of the stages.

9. The temperature sensor of claim 6, wherein the first, second and all signals comprise a ternary signal.

10. The temperature sensor of claim 2, wherein the ring oscillator comprises a plurality of inverter stages and a switch, and wherein in response to an on signal the switch activates all the stages and wherein in response to an off signal, the switch deactivates the ring oscillator, such that the switch is an on-off switch.

11. The temperature sensor of claim 1, wherein the sensor is calibrated prior to deployment.

12. The temperature sensor of claim 11, wherein the sensor resides in a constant temperature bath prior to deployment.

13. The temperature sensor claim 12, wherein the bath can be set at a predetermined temperature.

14. The temperature sensor of claim 12, wherein the bath can be set at a plurality of predetermined temperatures.

15. The temperature sensor of claim 12, wherein the sensor is sheathed in a cell.

16. The temperature sensor of claim 15, wherein an antenna is attached to the cell.

17. The temperature sensor of claim 12, wherein the sensor transmits a signal indicative of a measured temperature.

18. The temperature sensor of claim 1, wherein the signal is modulated by shifting the phase of the vibrating frequency.

19. The temperature sensor of claim 18, wherein the ring oscillator comprises a plurality of delay elements and at least one inverter stage.

20. The temperature sensor of claim 19, wherein the delay elements relate to the temperature of said predetermined location.

21. The temperature sensor of claim 19, wherein the ring oscillator further comprises a multiplexor and wherein each delay element is individually connected to the multiplexor, so that at least one delay element is selected by the multiplexor.

22. The temperature sensor of claim 21, wherein the ring oscillator further comprises a first pseudorandom number generator operatively connected to the multiplexor, so that a pseudorandom pattern is superimposed onto the signal transmitted from the sensor to the receiver.

23. The temperature sensor of claim 22, wherein the receiver comprises a second pseudorandom number generator and an oscillator.

24. The temperature sensor of claim 23, wherein the receiver further comprises a plurality of shift registers.

25. The temperature sensor of claim 23, wherein the second pseudorandom number generator is synchronized to the first pseudorandom number generator, and the oscillator's frequency is adjusted to match the frequency of the transmitted signal.

26. The temperature sensor of claim 21, wherein the receiver comprises a phase locked loop.

27. The temperature sensor of claim 21, wherein the receiver comprises a modified phase locked loop.

* * * * *